US008273663B2

(12) United States Patent
Smith et al.

(10) Patent No.: US 8,273,663 B2
(45) Date of Patent: Sep. 25, 2012

(54) PROCESS FOR ANISOTROPIC ETCHING OF SEMICONDUCTORS

(75) Inventors: Terry L. Smith, Roseville, MN (US); Jun-Ying Zhang, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 117 days.

(21) Appl. No.: 12/940,169

(22) Filed: Nov. 5, 2010

(65) Prior Publication Data

US 2011/0108861 A1    May 12, 2011

Related U.S. Application Data

(60) Provisional application No. 61/259,289, filed on Nov. 9, 2009.

(51) Int. Cl.
*H01L 21/311* (2006.01)
*H01L 21/302* (2006.01)

(52) U.S. Cl. ........ 438/694; 438/696; 438/700; 438/703; 438/734

(58) Field of Classification Search .................. None
See application file for complete search history.

(56) References Cited

U.S. PATENT DOCUMENTS

| | | | |
|---|---|---|---|
| 4,620,898 A * | 11/1986 | Banks et al. ............. 204/192.34 |
| 5,404,027 A | 4/1995 | Haase et al. | |
| 5,501,893 A | 3/1996 | Laermer et al. | |
| 5,538,918 A | 7/1996 | Haase et al. | |
| 6,054,391 A | 4/2000 | Nam et al. | |
| 6,277,756 B1 * | 8/2001 | Ohara et al. ................... 438/700 |
| 6,284,148 B1 | 9/2001 | Laermer et al. | |
| 6,347,874 B1 | 2/2002 | Boyd et al. | |
| 6,379,016 B1 | 4/2002 | Boyd et al. | |
| 6,495,455 B2 | 12/2002 | Vassalli et al. | |
| 6,720,268 B1 | 4/2004 | Laermer et al. | |
| 7,402,831 B2 | 7/2008 | Miller et al. | |
| 2004/0173575 A1 | 9/2004 | Kumar et al. | |
| 2005/0093098 A1 | 5/2005 | Hirose et al. | |
| 2005/0136682 A1 | 6/2005 | Hudson et al. | |
| 2006/0141794 A1 | 6/2006 | Laermer et al. | |
| 2009/0015757 A1 | 1/2009 | Potts et al. | |

FOREIGN PATENT DOCUMENTS

| | | |
|---|---|---|
| EP | 0774772 | 5/1997 |
| JP | 2005353972 | 12/2005 |
| WO | 2008/083188 | 7/2008 |

(Continued)

OTHER PUBLICATIONS

Article: Xei-Xi Chen et al., "Ion Beam Etcing of InGaAs, InP, GaAs, Si, and Ge," *J. of Vac. Sci, & Technol. B: Microelectronics and Nanometer Structures*, May 1986, vol. 4, Issue 3, pp. 701-705.

(Continued)

*Primary Examiner* — Scott B Geyer
(74) *Attorney, Agent, or Firm* — Stephen F. Wolf; Steven E. Skolnick

(57) ABSTRACT

A method is provided for anisotropically etching semiconductor materials such as II-VI and III-V semiconductors. The method involves repeated cycles of plasma sputter etching of semiconductor material with a non-reactive gas through an etch mask, followed by passivation of the side walls by plasma polymerization using a polymer former. Using this procedure small pixels in down-converted light-emitting diode devices can be fabricated.

14 Claims, 3 Drawing Sheets

FOREIGN PATENT DOCUMENTS

WO  WO 2008-153674 A1  12/2008
WO  2009/085660  7/2009

OTHER PUBLICATIONS

International Search Report for PCT/US2010/055573, pp. 3.

Bacher, "Deep Etched ZnSe-Based Nanostructures for Future Optoelectronic Applications", *Phys. Stat. Sol. (b)*, vol. 187, pp. 371-377, (1995).

Eisert, "Wavelength Control in II-VI Laser Diodes with First Order Distributed Bragg Reflectors", *App. Phys. Lett.*, vol. 71, No. 8, pp. 1026-1028, (Aug. 1997).

Haase, "Low-threshold Buried-ridge II-VI Laser Diodes", *Appl. Phys. Lett.*, vol. 63, No. 17, pp. 2315-2317 (Oct. 1993).

Lee, "Investigation of Masking Materials for High-Ion-Density $Cl_2$/Ar Plasma Etching of GaAs", *Semicond. Sci. Technol.*, vol. 11, pp. 812-815, (1996).

Srivastav, "Overview of Etching Technologies Used for HgCdTe", *Opto-Electronics Rev.*, vol. 13, No. 3, pp. 197-211, (2005).

Stoltz, "Comparing ICP and ECR Etching of HgCdTe, CdZnTe, and CdTe", *Journal of Electronic Materials*, vol. 36, No. 8, pp. 1007-1012, (2007).

Sugata, "Characterization of Damage on GaAs in a Reactive Ion Beam Etching System Using Schottky Diodes", *J. Vac. Sci. Technol. B*, vol. 6, No. 3, pp. 876-879, (May/Jun. 1988).

\* cited by examiner

PROCESS FOR ANISOTROPIC ETCHING OF SEMICONDUCTORS

CROSS REFERENCE TO RELATED APPLICATION

This application claims the benefit of U.S. Provisional Patent Application No. 61/259,289, filed Nov. 9, 2009, the disclosure of which is incorporated by reference herein in its entirety.

FIELD

This disclosure broadly relates to a process for anisotropic etching of semiconductors.

BACKGROUND

The rapid development of optoelectronics has produced a desire for methods of producing nanometer-sized patterns on semiconductor surfaces. Typically, these patterns are etched into semiconductor substrates by a number of techniques. For example, wet chemical etching has been used to etch a wide variety of semiconductors. Typically, for the case of II-VI semiconductors such as ZnSe, wet chemical etching utilizes bromine-based chemistries. Wet chemical etching proceeds by oxidation of the semiconductor constituents followed by chemical dissolution of the oxides in suitable solvents. Wet chemical etching can be isotropic and the uniformity of the process is low. Production industries in the optoelectronics. industries require more controlled etching procedures than can be achieved using wet etching.

As a result of the shortcomings of wet chemical etching, dry etching processes have been developed for semiconductors. For example, plasma-etching has been used to produce etching profiles in silicon substrates. Plasma-etching involves generating chemically reactive species, radicals, ions, and electrons at low pressure in a reactive gas mixture in a reactor with the aid of an electric discharge. The reactive species, radicals, ions generated in this manner are accelerated towards a substrate by means of an electrical field. The ions fall virtually vertically onto the substrate, and promote the reaction of the reactive plasma species with the silicon substrate. An etch mask can be applied to the substrate prior to etching to allow the ions to etch a pattern into the substrate. Because of the nearly vertical fall of the positively-charged particles, etching is much more slow on the side-walls the etched substrate as the etching progresses.

To further protect and passivate the side-walls, polymer formers, which are added to the plasma at selected times during etching, can be used to protect the side-walls of the etched structure by means of a formed polymeric film. This method has been used to anisotropically etch silicon substrates.

SUMMARY

Some semiconductor materials, such as II-VI semiconductor materials, are not easily reactive-ion etched. Thus, it would be desirable to have a rapid, efficient, process for anisotropically etching semiconductors, particularly II-VI semiconductors, using relatively simple techniques. It would also be desirable to be able to achieve deep etch features in the semiconductors that have near vertical side walls. It would also be desirable to be able to define pixel images or to form light extractors, via anisotropic etching, directly on semiconductor chips.

In one aspect, a method of anisotropic etching a semiconductor is provided that includes providing a semiconductor having an etching mask thereon in a vacuum chamber, sputter etching the semiconductor through the etching mask, with an etching gas to remove material from the surface of the semiconductor and to provide at least one etched surface, introducing a polymer former into the vacuum chamber, polymerizing the polymer former onto the at least one exposed surface of the semiconductor, and repeating the etching step and the polymerizing step to form an etched semiconductor. This method can be useful for anisotropic etching of semiconductors and, in particular, II-VI semiconductors that include cadmium, magnesium, zinc, selenium, tellurium, or combinations thereof. The etching gas can include non-reactive gases such as argon, krypton, xenon, nitrogen, or any other substantially nonreactive gaseous species. These materials are capable of ejecting surface material on semiconductors upon impact and momentum transfer. The polymer former can be trifluoromethane. The etched semiconductor can be a part of a light-emitting diode and can define image pixels, extract light, or perform other optical transformations.

In this disclosure:

"extraction elements" refers to any type and arrangement of nano/microstructures enhancing light extraction from self-emissive light sources such as light-emitting diodes;

"nonreactive gas" refers to a gas that can be used to sputter etch a substrate by physical etching. Sputter etching byproducts are non-volatile. Sputter etching occurs primarily through physical bombardment of the surface with ionized species, which can displace or expel surface atoms through momentum transfer, and do not substantially chemically react with a substrate;

"reactive ion etching" refers to the process of ionizing a chemically reactive gas with a plasma and accelerating it towards a substrate with which it can chemically react to form volatile species; and "sputter etching" refers to the bombardment of a substrate with atoms or molecules so as to remove material from the substrate by transfer of momentum from the atoms or molecules to the material on the substrate; it is differentiated from reactive ion etching in that the species in the etching gas physically remove substrate material by momentum transfer, rather than by chemical reaction.

The provided method and structures made by the provided method can etch deep, vertical-walled features into semiconductor materials, such as II-VI semiconductor materials. The method can not only improve the etch profile of semiconductor materials (make them more vertical), but also can protect the freshly-etched materials from degradation when exposed to atmospheric conditions.

The above summary is not intended to describe each disclosed embodiment of every implementation of the present invention. The brief description of the drawing and the detailed description which follows more particularly exemplify illustrative embodiments.

DETAILED DESCRIPTION

Figure 1A:
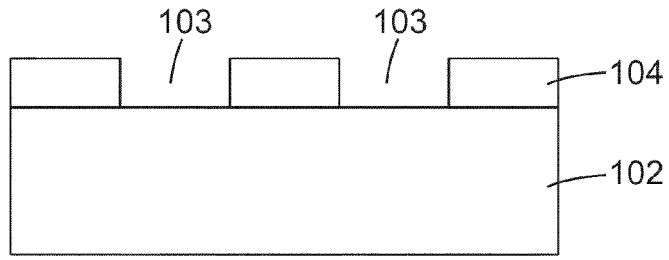
FIGS. 1a-1e are side-view schematic drawings of steps in the provided process.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Plasma-based etching processes for achieving deep, vertical-walled features in silicon are known. The most extensively used method for anisotropic etching of silicon is the so-called "Bosch" process that is described, for example, in U.S. Pat. Nos. 5,501,893; 6,284,148; 6,720,268; and U.S. Pat. Publ. No. 2006/0141794 (all Laermer et al.). The Bosch process involves a series of alternating plasma reactive-ion etching steps and plasma polymer deposition (passivation) steps, each process lasting only a few seconds. Typically, a plasma from a reactive etching gas such as, for example, $SF_6$, $NF_3$, or $ClF_3$ is used to etch the silicon during the etching step. The ionized reactive gas is accelerated towards the target substrate and then reacts with the substrate material to form volatile reactants which leave the surface of the substrate. After the reactive-ion etching step, a plasma polymer deposition step is performed in which a plasma of a fluorocarbon gas such as, for example, $C_4F_8$ or $CF_4$, is used to deposit a polymer passivation layer on all surfaces to suppress lateral etching. High productivity using the Bosch cycle requires rapid cycling between the etching and the passivation cycles and therefore specialized equipment capable of rapid pumping, and quick-response mass flow controllers is required. Furthermore, the gas feed lines for the etching and the passivating gas (polymer former) need to be very short (less than about 20 cm) in order to reduce the time required to change the process gases. The Bosch process also requires that the substrate be reactive with the reactive ion species used, and that it form volatile species which can be removed from the etching site via pumping.

The provided process can use conventional etching equipment and can thus obviate the needs for special equipment. The provided process is similar to the Bosch process used on silicon as described above, but uses sputter etching instead of reactive-ion etching. For this reason, the provided process can be useful on semiconductor materials for which a convenient reactive ion species is not available, or when the use of reactive species may damage the semiconductor, for example via corrosion. In some embodiments, the provided process can be useful for etching semiconductor materials including, for example, III-V semiconductor materials such as, for example, GaAs, InP, AlGaAs, GaInAsP, or GaInNAs. In other embodiments, the provided process is useful for etching II-VI semiconductor materials such as, for example, materials that can include cadmium, magnesium, zinc, selenium, tellurium, and combinations thereof. An exemplary II-VI semiconductor material can include CdMgZnSe alloy. Other II-VI semiconductor materials such as CdZnSe, ZnSSe, ZnMgSSe, ZnSe, ZnTe, ZnSeTe, HgCdSe, and HgCdTe can also be etched using the provided process.

A semiconductor material to be etched is placed in a vacuum chamber and provided with an etching mask. Typical etching masks can be made of materials such as photoresist, $SiO_2$, $SiN_x$, and W. Useful photoresists can also include positive photoresists that include a polymer that becomes soluble in a basic developer upon exposure to radiation and negative photoresists that cross-link and become insoluble upon exposure to radiation. Exemplary positive photoresists include UV5 photoresist and Shipley 1813 photoresist (both available from Rohm and Hass Electronic Materials, Marlborough, Mass.). Exemplary negative photoresists include UVN 30 (available from Rohm and Haas Electronic Materials), and FUTURREX negative photoresists, such as NR9-1000P and NR9-3000PY (available from Futurrex, Franklin, N.J.). Photoresists are well known to those of ordinary skill in the art of semiconductor lithography. A process for sputter etching II-VI or III-V semiconductors using a photoresist etching mask is described in application, Ser. No. 61/259,299, filed on the same day herewith.

The semiconductor material can then be sputter etched by bombardment of the surface (sputter etching) of the semiconductor material with molecules of a nonreactive etching gas. The etching gas molecules or atoms (etchant) can remove or eject material (byproducts) from an exposed surface of the semiconductor. The etching typically occurs on surfaces of the semiconductor that are not protected by the etching mask. The etching mask can have patterned openings that, for example, define image pixels or provide patterns for producing light extractors on the surface of the semiconductor material. The nonreactive etching gas impinges on the surface of the semiconductor material in a substantially vertical manner. That is, the ionized etchant is configured to strike the surface of the semiconductor material in essentially a straight line—typically at or near right angles to the surface of the semiconductor material. The etchant can remove or expel exposed molecules from the semiconductor material by transfer of kinetic energy.

Exemplary nonreactive etching gases (etchants) can include argon, krypton, xenon, nitrogen, or combinations thereof. These gases have little or no tendency to react with semiconductor material since they are substantially inert gases. Thus, they tend to etch by physical bombardment, transferring momentum to the molecules on the exposed surface of the semiconductor material. This material then can be ejected and can damage other previously etched surfaces, such as the etched vertical surface of the semiconductor wall. Alternatively, the ejected material can deposit elsewhere in the vacuum chamber as debris. The debris can build up and eventually contaminate the etching process, therefore debris is typically removed periodically by cleaning the vacuum chamber.

For a number of applications it is advantageous to etch the semiconductor material to achieve deep, vertical-walled etch features. Sputter etching, as described above, is a physical etching, expels semiconductor material (the material removed from the surface) through physical bombardment of the surface with ions. This expelled material can then erode the profile of the vertical walls (lateral etching) that have been etched by the etchant—thus deteriorating the features that are being etched into the semiconductor material. In order to produce deep, vertical walls in the etched features a passivation layer can be deposited after the initial etching to protect against lateral etching. After the initial etching, a polymer former can be introduced into the vacuum chamber to flush out the etching gas. Polymer deposition is then performed using a plasma polymerization process to create the polymer. During the polymer deposition step, the exposed surfaces, i.e. the etching floor and the side surfaces of the etched semiconductor material, are covered uniformly with a polymer. This polymer layer on the edges and surfaces of the etching mask forms a highly effective temporary etch stop. The polymer layer applied onto the etching floor during the polymerization step is rapidly broken through during a subsequent etching step, since the polymer is very quickly removed when the etchant ions impinge on it at normal incidence. The sidewalls of the features being etched remain protected during the etching step by the sidewall polymer applied during the previous polymer deposition step or steps.

Polymer formers can include monomers that can form fluorinated polymers. These include $C_4F_8$, $C_3F_6$, fluorocarbons having an even lower fluorine to carbon ratio, such as $CF_4$, $C_4F_6$ (hexafluoro-1,3-butadiene) or $C_5F_8$ (octafluoro-1, 3-pentadiene) and $C_2H_2F_2$ (difluoroethylene). Other useful polymer formers include $CHF_3$ (trifluoromethane) and other fluorine-containing gases for example, octafluorocyclobutane (FREON C 318, available from DuPont, Wilmington, Del.), hexafluoropropene (HFP, available from Hoechst, Frankfurt, Germany), or tetrafluoroethylene.

The etching steps and the plasma polymerization (passivation) steps can be repeated alternatingly until a predetermined etching depth of the structures in the etched semiconductor material is reached. It is particularly useful when the etching rate of the polymer passivation layer is less than that of the semiconductor substrate. For example, when the nonreactive etching gas is argon and the semiconductor material is a II-VI semiconductor such as MgCdZnSe alloy, the semiconductor can be etched at about twice the rate of the passivation polymer when the polymer is derived from trifluoromethane. With this exemplary system, etching depths of several micrometers can be reached in about 6-15 etching/passivating cycles.

Figure 1B:
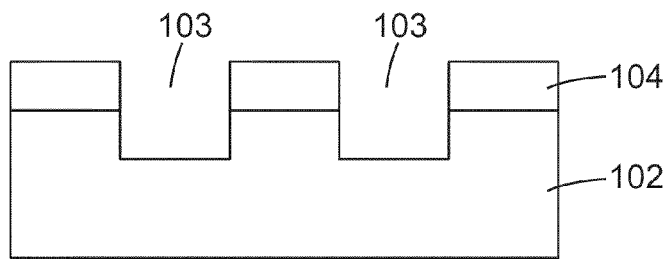
Figure 1C:
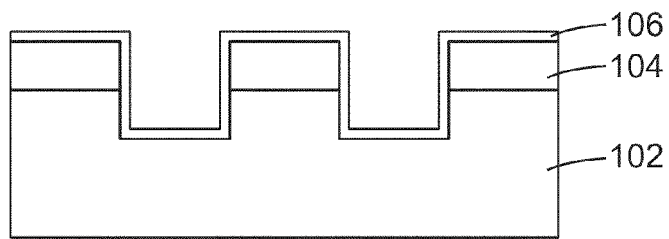
Figure 1D:
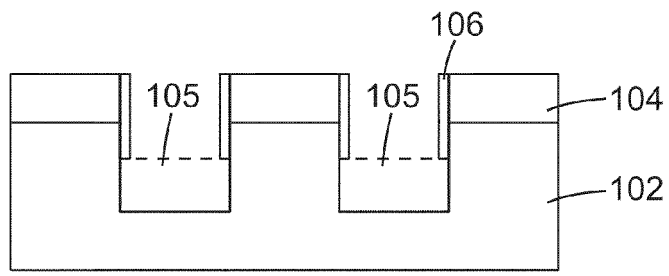
Figure 1E:
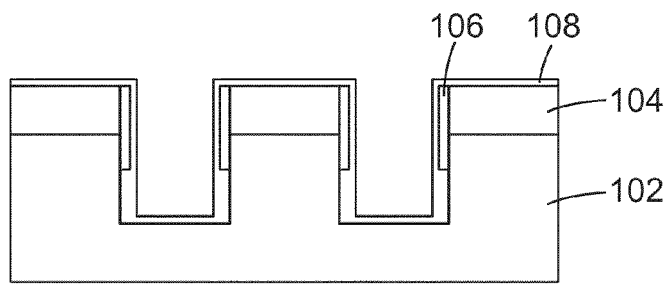

The provided method can be better understood by references to the drawings. FIGS. 1a-1e are side-view schematic drawings of steps in the provided method. FIG. 1a is a drawing that includes semiconductor material 102 with patterned photoresist 104 disposed thereon. Patterned photoresist 104 has trenches 103 that expose portions of semiconductor material 102. Sputter etching of semiconductor material 102 is performed using a nonreactive gas. FIG. 1b shows that after sputter etching, trench 103 has been extended so that a portion of exposed semiconductor material 102 that is not covered by photoresist 104 has been etched below the original surface of semiconductor material 102. FIG. 1c is an illustration of the semiconductor material after a plasma polymerized passivation layer deposited on the etched semiconductor material. Etched semiconductor material 102 (from FIG. 1b) still has patterned photoresist 104 in unetched areas. Passivation polymer 106 has been deposited on all surfaces of semiconductor 102. FIG. 1d shows semiconductor material 102 from FIG. 1c after a second sputter etching step. Etching proceeds on top surfaces and removes the passivation polymer except in edge surfaces that are less exposed to the normal incidence of the ionized etching gas. The result is that passivation polymer 106 remains on the side or edge walls of etched trench 105. Thus, the trench is etched deeper but the vertical side walls are retained. The passivation process is repeated as shown in FIG. 1e. The result is that a new passivation layer 108 is deposited on semiconductor material 102. At least some of the passivation polymer 106 remains on the side walls.

The provided method of anisotropic etching of semiconductor materials can be used to form deep, vertical-walled etched features, such as, for example, light extraction elements, into semiconductor materials. In some embodiments, the provided method can be used to etch trenches that define small pixels in displays on electronic devices made using II-VI semiconductors. These pixels can be very small. For example, the pixels can have a longest dimension of less than about 10 micrometers. The pixels can be separated by trenches that are less than about 5 micrometers. Such exemplary devices include down-converted light-emitting diodes (LEDs). In other embodiments, the provided method can be used to form light extractors on the face of LEDs made from II-VI semiconductors. Such light extractors can redirect the light emitted from the LED face. Exemplary light extraction elements are not limited to any types of structures. In some embodiments, light extraction elements can include diffractive or scattering nanostructures as disclosed, for example, in U.S. Pat. Publ. No. 2009/0015757 (Potts et al.); structures with risers as disclosed, for example, in U.S. Pat. Nos. 6,347,874 and 6,379,016 (both Boyd et al.); and structures such as those disclosed in PCT Pat. Publ. No. WO 2008/083188 (Lu et al.).

Objects and advantages of this invention are further illustrated by the following examples, but the particular materials and amounts thereof recited in these examples, as well as other conditions and details, should not be construed to unduly limit this invention.

EXAMPLES

Figure 2:
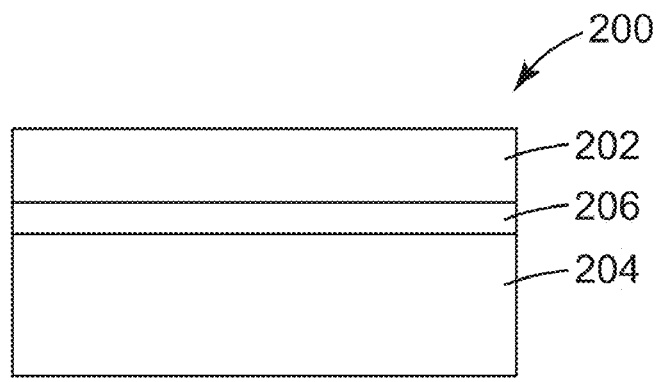
FIG. 2 is a side-view schematic drawing of an exemplary semiconductor useful in the provided process.

A II-VI semiconductor color converter layer structure based upon MgCdZnSe alloy was grown by molecular beam epitaxy on an InP substrate. Details of color converter structures may be found, for example, in U.S. Pat. No. 7,402,831 (Miller et al.). The color converter layer structure is shown schematically in FIG. 2, and the layer thicknesses and compositions are shown in Table I below. FIG. 2 is a schematic of color converter layer 200 that includes top window 202, absorber 204, and a graded compositional layer 206 that gradually changes from the composition of top window 202 to absorber 204.

TABLE I

Composition of Color Converter Layer Structure

| Layer | Parts Cd | Parts Mg | Parts Zn | Parts Se | Thickness (μm) |
|---|---|---|---|---|---|
| Top Window | 0.15 | 0.55 | 0.30 | 1.00 | 0.50 |
| Grading Layer | 0.15-0.29 | 0.55-0.34 | 0.30-0.37 | 1.00 | 0.25 |
| Absorber | 0.29 | 0.34 | 0.37 | 1.00 | 1.50 |

A photoresist pattern of ridges was created on the II-VI semiconductor structure described above using a negative photoresist (NR1-1000P, available from Futurrex, Franklin, N.J.) and conventional contact lithography. The sample was then cleaved into small pieces for etching as described in the following examples. The etching was conducted in a commercial reactive ion system (RIE, Model PLASMA LAB System 100, available from Oxford Instruments, Yatton, UK).

Comparative Example 1

Ar Etching without Passivation

Figure 3:
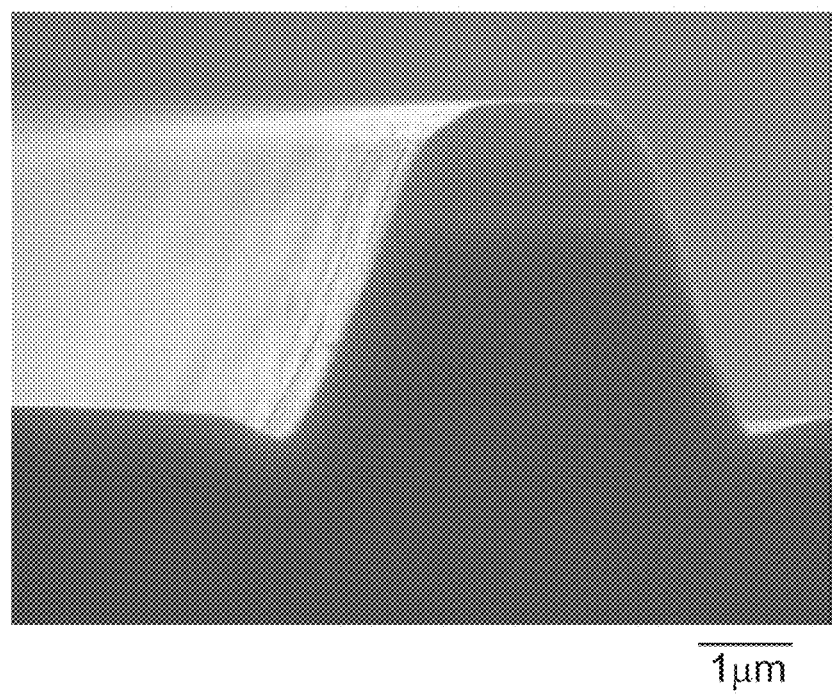
FIG. 3 is a scanning electron photomicrograph of Comparative Example 1.

A small cleaved sample of the II-VI semiconductor with a photoresist mask thereon was put on a Si carrier wafer, loaded into the RIE chamber, and plasma etched using 5-50 sccm Ar, 10-200 Watts Rf power, 700-2000 Watts inductively coupled plasma power, at a pressure of 4-50 mTorr and an etch time of 4×1 minute intervals. The resulting structure had a profile with a wall angle of about 63° with Ar sputter etching as shown in the photomicrograph of FIG. 3.

Example 1

Combined Ar Etching and $CHF_3$ Passivation

Figure 4:
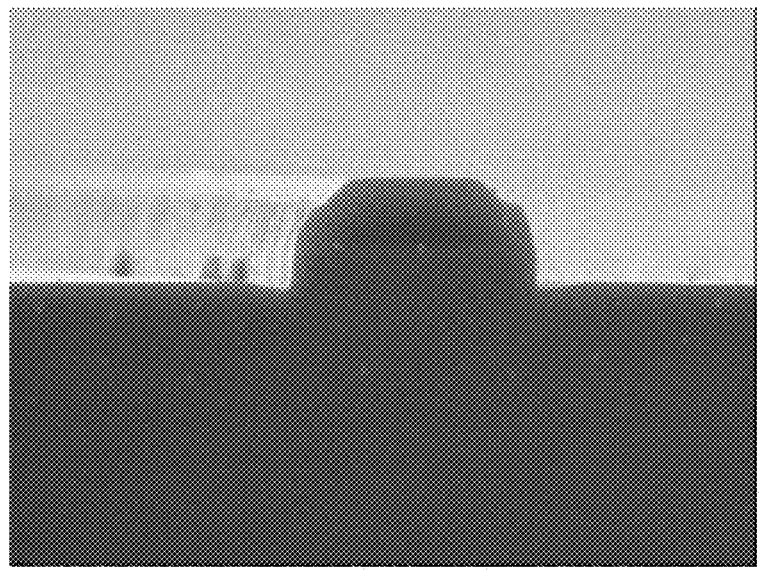
FIG. 4 is a scanning electron photomicrograph of Example 1.

A piece of the sample from Comparative Example 1 also overlaid with a photoresist mask was etched as follows:
a) The sample was first Ar sputter etched for 30 seconds under the same conditions listed in Table I.
b) The plasma and argon gas supply were turned off and trifluoromethane ($CHF_3$) was allowed to flow into the process chamber at a rate of 40 sccm for 30 seconds.
c) The plasma was restored, and plasma polymerization of the trifluoromethane was carried out using 5-40 sccm $CHF_3$, 20-200 Watts Rf power, 700-2000 Watts inductively coupled plasma power, at a pressure of 4-30 mTorr and an etch time 5 seconds.
d) The trifluoromethane supply was turned off and Ar gas was allowed to flow into the chamber at 40 sccm for 30 seconds.
e) The process a) to d) was repeated a total of 8 times.
FIG. 4 is a scanning electron photomicrograph of the CdMg-ZnSe crystal using the process a)-e). It can be observed that an etch profile with a wall angle of about 90 degrees was achieved with the combined process.

Example 2

Figure 5:
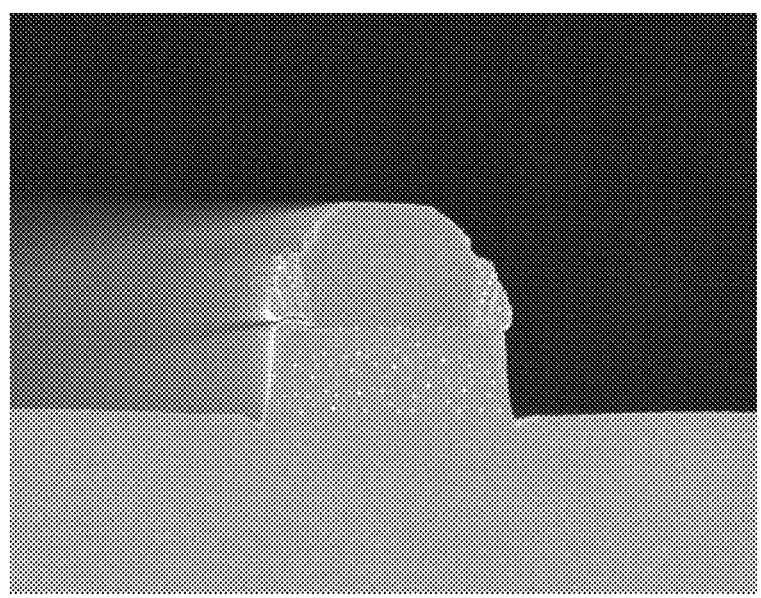
FIG. 5 is a scanning electron photomicrograph of Example 2.

A piece of the sample from Comparative Example 1 also overlaid with a photoresist mask made with NR9-300PY negative photoresist available from, available from Futurrex, Franklin, N.J.) was etched using the procedure of Example 1 except that the Ar etching was carried out for 60 seconds and the steps a) to d) were repeated 6 times. FIG. 5 is a scanning electron photomicrograph of the resultant structure and shows deep etching of the II-VI material with almost 90 degree wall angle. The etch rates were calculated to be 341 nm/min for the semiconductor material and 126 nm/min for the photoresist material.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited in this disclosure are herein incorporated by reference in their entirety.

What is claimed is:

1. A method of anisotropically etching a semiconductor comprising:
   providing a II-VI semiconductor having an etching mask thereon in a vacuum chamber;
   sputter etching the II-VI semiconductor through the etching mask, with a nonreactive etching gas to remove material from the surface of the semiconductor and to provide at least one etched surface;
   introducing a polymer former into the vacuum chamber;
   polymerizing the polymer former onto the exposed surfaces of the II-VI semiconductor; and
   repeating the etching step and the polymerizing step to form an etched II-VI semiconductor.

2. A method according to claim 1, wherein the II-VI semiconductor comprises cadmium, magnesium, zinc, selenium, tellurium, or combinations thereof.

3. A method according to claim 2, wherein the II-VI semiconductor comprises a CdMgZnSe alloy.

4. A method according to claim 1, wherein the nonreactive etching gas comprises argon, krypton, xenon, nitrogen, or combinations thereof.

5. A method according to claim 1, wherein the polymer former is selected from $CF_4$, $CHF_3$, $C_4F_8$, $C_3F_6$, $C_4F_6$, $C_5F_8$, $C_2H_2F_2$, and combinations thereof.

6. A method according to claim 5, wherein the polymer former comprises $CHF_3$.

7. A method according to claim 1 wherein the etching gas comprises argon and the polymer former comprises $CHF_3$.

8. A method of anisotropically etching a semiconductor comprising:
   providing a semiconductor having an etching mask thereon in a vacuum chamber;
   sputter etching the semiconductor through the etching mask, with a nonreactive etching gas to remove material from the surface of the semiconductor and to provide at least one etched surface;
   introducing a polymer former into the vacuum chamber;
   polymerizing the polymer former onto the exposed surfaces of the semiconductor; and
   repeating the etching step and the polymerizing step to form an etched semiconductor;
   wherein the etched semiconductor is a part of a light-emitting diode.

9. A method according to claim 8, wherein the etched semiconductor of the light-emitting diode defines image pixels, extracts light, or a combination thereof.

10. A method according to claim 8, wherein the etched semiconductor is part of a down-converted light-emitting diode.

11. A method according to claim 8, wherein the nonreactive etching gas comprises argon, krypton, xenon, nitrogen, or combinations thereof.

12. A method according to claim 8, wherein the polymer former is selected from $CF_4$, $CHF_3$, $C_4F_8$, $C_3F_6$, $C_4F_6$, $C_5F_8$, $C_2H_2F_2$, and combinations thereof.

13. A method according to claim 12, wherein the polymer former comprises $CHF_3$.

14. A method according to claim 8 wherein the etching gas comprises argon and the polymer former comprises $CHF_3$.

* * * * *